US012332314B2

United States Patent
He et al.

(10) Patent No.: US 12,332,314 B2
(45) Date of Patent: Jun. 17, 2025

(54) GENERATOR FAULT DETECTION METHOD BASED ON THE CHARACTERISTICS OF AIR GAP MAGNETIC FLUX DENSITY

(71) Applicant: North China Electric Power University (Baoding), Baoding (CN)

(72) Inventors: Yuling He, Baoding (CN); Wen Zhang, Baoding (CN); Yong Li, Baoding (CN); Yifan Bai, Baoding (CN); Mingxing Xu, Baoding (CN); Xiaolong Wang, Baoding (CN)

(73) Assignee: North China Electric Power University (Baoding), Baoding (CN)

( * ) Notice: Subject to any disclaimer, the term of this patent is extended or adjusted under 35 U.S.C. 154(b) by 245 days.

(21) Appl. No.: 18/210,659

(22) Filed: Jun. 16, 2023

(65) Prior Publication Data
US 2024/0369635 A1 Nov. 7, 2024

(30) Foreign Application Priority Data
Apr. 20, 2023 (CN) .......................... 202310425801.1

(51) Int. Cl.
*G01R 31/34* (2020.01)
*H02K 11/215* (2016.01)
*H02K 29/08* (2006.01)

(52) U.S. Cl.
CPC .......... *G01R 31/343* (2013.01); *H02K 11/215* (2016.01); *H02K 29/08* (2013.01); *H02K 2201/03* (2013.01); *H02K 2213/03* (2013.01)

(58) Field of Classification Search
CPC .... G01R 31/34; G01R 31/343; H02K 11/215; H02K 29/08; H02K 2201/03; H02K 2213/03; Y04S 10/52

(Continued)

(56) References Cited

U.S. PATENT DOCUMENTS

2010/0141080 A1* 6/2010 Tang ................... H02K 1/165
                                                          310/216.111
2018/0045784 A1* 2/2018 Gajanayake ....... G01R 33/1215

FOREIGN PATENT DOCUMENTS

CN         101694508 B   *  8/2011
CN         110690770 A   *  1/2020  ............... H02K 1/16
                                (Continued)

OTHER PUBLICATIONS

Machine translation of Gou et al. Chinese Patent Document CN 110690770 A Jan. 2020 (Year: 2020).*

(Continued)

*Primary Examiner* — Kevin J Comber
(74) *Attorney, Agent, or Firm* — Bayramoglu Law Offices LLC

(57) ABSTRACT

A generator fault detection method based on the characteristics of air gap magnetic flux density includes the following steps: S1: installing detection devices on a generator and building a test platform; S2: obtaining an air gap magnetic flux density signal through the detection devices; S3: transforming a time domain signal of the magnetic flux density into a frequency domain signal by using a fast Fourier transform; S4: judging if the generator has an air gap eccentricity or a stator inter-turn short circuit fault through the comparison of time domain and frequency domain; S5: obtaining a value of air gap magnetic flux density by calculation, selecting and then comparing a root mean square value of magnetic flux density under different working conditions with the root mean square value of magnetic flux density under normal condition to determine a fault degree.

6 Claims, 7 Drawing Sheets

(58) Field of Classification Search
USPC .......................................................... 361/20
See application file for complete search history.

(56) References Cited

FOREIGN PATENT DOCUMENTS

| CN | 113946946 A | * | 1/2022 | ............. G06F 17/11 |
| WO | WO-2021074248 A1 | * | 4/2021 | ............. G01H 1/003 |
| WO | WO-2022083014 A1 | * | 4/2022 | ............. H02K 1/165 |

OTHER PUBLICATIONS

Machine translation of Li et al. Chinese Patent Document CN 101694508 B Aug. 2011 (Year: 2011).*
Machine translation of Du et al. International Patent Document WO 2022083014 A1 Apr. 2022 (Year: 2022).*
Machine translation of Shi et al. Chinese Patent Document CN 113946946 A Jan. 2022 (Year: 2022).*

* cited by examiner

GENERATOR FAULT DETECTION METHOD BASED ON THE CHARACTERISTICS OF AIR GAP MAGNETIC FLUX DENSITY

CROSS REFERENCE TO THE RELATED APPLICATIONS

This application is based upon and claims priority to Chinese Patent Application No. 202310425801.1, filed on Apr. 20, 2023, the entire contents of which are incorporated herein by reference.

TECHNICAL FIELD

The present invention relates to the field of generator detection technology, in particular to a generator fault detection method based on the characteristics of air gap magnetic flux density.

BACKGROUND

Air gap eccentricity fault is a common mechanical fault in generators, it usually refers to the radial unevenness of the air gap between the rotor and the stator, generally speaking, according to the change of the minimum position of the air gap, the air gap radial eccentricity can be divided into the radial static eccentricity of the air gap, the radial dynamic eccentricity of the air gap and the radial dynamic and static mixed eccentricity of the air gap. The radial static eccentricity of the air gap is caused by the inaccurate installation of the stator and rotor and the bearing wear of the generator in long-term operation, while the dynamic eccentricity is caused by the uneven roundness and thermal bending of the rotor surface. The air gap radial eccentricity will lead to an unbalanced magnetic pull on the stator core, aggravate the vibration of the stator core and lead to core deformation and winding insulation damage. The axial eccentricity of the air gap will cause the rotor core to produce an unbalanced magnetic pull, resulting in cracks in the rotor core, which will aggravate the eddy current loss and cause the rotor to overheat. In addition to the air gap eccentricity fault, stator inter-turn short circuit fault is a common electrical fault in the generator, and its fault rate accounts for about 30% to 40% of the entire motor fault. After the inter-turn short circuit, the stator winding will not only increase the vibration amplitude but also generate a high heat, which will eventually lead to insulation failure and cause the generator to stop. Therefore, a generator fault detection method based on the characteristics of air gap magnetic flux density is provided.

SUMMARY

The purpose of the present invention is to provide a generator fault detection method based on the characteristics of air gap magnetic flux density. The air gap magnetic flux density of the generator can be detected, which can directly reflect the operating state of the generator. The Hall sensor can be used to directly measure the air gap magnetic flux density of the generator. It can not only detect the air gap eccentricity fault and stator inter-turn short circuit fault but also diagnose the fault location and degree. It has a positive significance for the smooth operation of the generator and solves the problem in the background material.

To achieve the above purpose, the present invention provides a generator fault detection method based on the characteristics of air gap magnetic flux density, including the following steps:

S1: installing detection devices on a generator and building a test platform;

S2: obtaining an air gap magnetic flux density signal through the detection devices;

S3: transforming a time domain signal of the magnetic flux density into a frequency domain signal by using a fast Fourier transform;

S4: confirming the operation condition of the generator through a comparison of the time domain and frequency domain;

S5: obtaining a value of air gap magnetic flux density by calculation, selecting, and then comparing a root mean square value of magnetic flux density under different working conditions with the root mean square value of magnetic flux density under normal condition to determine a degree of air gap eccentricity and a short circuit degree of stator inter-turn short circuit fault.

Preferably, the detection device in S1 is a Hall sensor, the foot of which is mounted into a stator slot in the generator.

Preferably, the test platform in S1 is that the generator is connected to a drive motor, a host computer is connected to a measuring instrument, and the measuring instrument is connected to the detection devices.

Preferably, the method for obtaining the air gap magnetic flux density in S2 is to measure the air gap magnetic flux density of the generator through the heads of the Hall sensors.

Preferably, in S3, uploading the collected flux density signal to the test platform and performing the fast Fourier transform to obtain the frequency domain signal of the air gap magnetic flux density, and recording the characteristic frequency amplitude of 0 Hz to 200 Hz.

Preferably, in S4, the specific method for confirming the operation of the generator through the comparison of the time domain and the frequency domain is to compare the collected time domain signal with the transformed frequency domain signal with spectrum components in the air gap magnetic flux density data sample under normal condition.

When the amplitude of the time domain waveform and the amplitude of each harmonic component in the spectrum of the air gap magnetic flux density of the generator increase, the generator has a radial eccentricity fault of the air gap.

When the amplitude of the time domain waveform and the amplitude of each harmonic component in the spectrum of the air gap magnetic flux density of the generator reduce, and no new harmonic component appears at the same time, the generator has an axial eccentricity fault of the air gap.

When the amplitude of the time domain waveform and the amplitude of each harmonic component in the spectrum of the air gap magnetic flux density of the generator reduce, and a 150 Hz frequency doubling component appears at the same time, the generator has a stator inter-turn short circuit fault.

Preferably, in S5, the working conditions of the generator are divided into four types: normal condition, air gap radial eccentricity, air gap axial eccentricity, and stator inter-turn short circuit, the expression of an air gap magnetomotive force of the generator in the above four conditions is calculated as follows:

$$f(\alpha_m, t) = \begin{cases} MF_r\cos(\omega t - p\alpha_m + 0.5\pi + \psi) + \\ MF_s\cos(\omega t - p\alpha_m) \ldots \text{normal condition/air} \\ \quad \text{gap radial eccentricity} \\ MF_{re1}\cos(\omega t - p\alpha_m + 0.5\pi + \psi) + \\ MF_{se1}\cos(\omega t - p\alpha_m) \ldots \text{air gap} \\ \quad \text{axial eccentricity} \\ MF_{r1}\cos(\omega t - p\alpha_m + 0.5\pi + \psi) + \\ MF_{r2}\cos(3\omega t - p\alpha_m + 0.5\pi + \psi) + \\ MF_{r2}\cos(\omega t + p\alpha_m - 0.5\pi - \psi) + MF_{s1+}\cos(\omega t - p\alpha_m) + \\ MF_{s1-}\cos(\omega t + p\alpha_m) + MF_{s3+}\cos(3\omega t - p\alpha_m) \ldots \text{stator} \\ \quad \text{inter-turn short circuit} \end{cases}$$

in the above formula, p is a number of poles of the generator, $\psi$ is an internal power angle of the generator, $\omega$ is an electrical frequency, t is a time, and $\alpha_m$ is a circumferential position angle of the air gap, $MF_r$ is a rotor magnetomotive force in normal conditions and the air gap radial eccentricity fault, which is generated by the permanent magnet, $MF_s$ is a stator magnetomotive force in normal conditions and the air gap radial eccentricity fault, which is generated by the stator winding, $MF_{re1}$ is a rotor magnetomotive force in the air gap axial eccentricity fault, which is generated by the permanent magnet, $MF_{se1}$ is a stator magnetomotive force, which is generated by the stator winding, and $MF_{r1}$ is an amplitude of the 2nd frequency magnetomotive force generated by the permanent magnet with a rotation angle of $-\alpha_m$ under the stator inter-turn short circuit fault, $MF_{r2}$ is an amplitude of 2nd frequency and 3rd frequency magnetomotive force generated by permanent magnet under stator inter-turn short circuit fault, $MF_{s1+}$ and $MF_{s1-}$ are the amplitudes of positive and negative rotation of stator magnetomotive force under stator inter-turn short circuit fault, respectively, $MF_{s3+}$ is the amplitude of 3rd frequency of the stator magnetomotive force under stator inter-turn short circuit fault;

the formula of a generator air gap radial length is as follows:

$$g(\alpha_m) = \begin{cases} g_0 \ldots \text{normal condition/stator inter-turn short} \\ \quad \text{circuit/air gap axial eccentricity} \\ g_0(1 - \delta_s\cos\alpha_m) \ldots \text{air gap radial eccentricity} \end{cases}$$

in the above formula, $g_0$ is an average length of the air gap under normal condition, $\alpha_m$ is a circumferential position angle of the air gap, and $\delta_s$ is a radial relative eccentricity of the air gap, a permeability per unit area is inversely proportional to the radial length of the air gap, which is expressed as the following formula:

$$\Lambda(\alpha_m) = \frac{\mu_0}{g(\alpha_m)} = \begin{cases} \Lambda_0 \ldots \text{normal condition/stator inter-turn short} \\ \quad \text{circuit/air gap axial eccentricity} \\ \Lambda_0(1 + 0.5\delta_s^2 + \delta_s\cos\alpha_m + 0.5\delta_s^2\cos2\alpha_m) \ldots \text{air gap} \\ \quad \text{radial eccentricity} \end{cases}$$

in the above formula, $\lambda_0$ is a permeability constant per unit area of the air gap, and $\mu_0$ is an air permeability;

the air gap magnetic flux density of the generator is obtained by multiplying the air gap magnetomotive force and the air gap permeance, the expression of the air gap magnetic flux density of the generator under four working conditions is as follows:

$$B(\alpha_m, t) = f(\alpha_m, t)\Lambda(\alpha_m) =$$

$$\begin{cases} MF_r\cos(\omega t - p\alpha_m + 0.5\pi + \psi) + \\ MF_s\cos(\omega t - p\alpha_m)\Lambda_0 \ldots \text{normal condition} \\ MF_r\cos(\omega t - p\alpha_m + 0.5\pi + \psi) + MF_s\cos(\omega t - p\alpha_m)\Lambda_0 \times \\ (1 + 0.5\delta_s^2 + \delta_s\cos\alpha_m + 0.5\delta_s^2 + \psi) + \\ MF_{r2}\cos\alpha_m) \ldots \text{air gap radial eccentricity} \\ MF_{re1}\cos(\omega t - p\alpha_m + 0.5\pi + \psi) + \\ MF_{se1}\cos(\omega t - p\alpha_m)\Lambda_0 \ldots \text{air gap axial eccentricity} \\ MF_r\cos(\omega t - p\alpha_m + 0.5\pi + \psi) + MF_{r2}\cos(3\omega t - p\alpha_m + 0.5\pi + \psi) + \\ MF_{r2}\cos(\omega t + p\alpha_m - 0.5\pi - \psi) + MF_{s1+}\cos(\omega t - p\alpha_m) + \\ MF_{s1-}\cos(\omega t + p\alpha_m) + MF_{s3+}\cos(3\omega t - p\alpha_m)\Lambda_0 \ldots \\ \text{stator inter-turn short circuit} \end{cases}$$

calculating the root mean square value of the air gap magnetic flux density amplitude under normal condition, air gap radial eccentricity, air gap axial eccentricity, and stator inter-turn short circuit fault by the above formula, the expression is as follows:

$$\begin{cases} B_{N(rms)} = \sqrt{(\Lambda_0 MF_r)^2 + (\Lambda_0 MF_s)^2} \\ B_{R(rms)} = \sqrt{\begin{aligned}&[(1 + 0.5\delta_s^2 + \delta_s\cos\alpha_m + 0.5\delta_s^2\cos\alpha_m)MF_r]^2 + \\ &[(1 + 0.5\delta_s^2 + \delta_s\cos\alpha_m + 0.5\delta_s^2\cos\alpha_m)MF_s]^2\end{aligned}} \\ B_{A(rms)} = \sqrt{(\Lambda_0 MF_{re1})^2 + (\Lambda_0 MF_{se1})^2} \\ B_{F(rms)} = \sqrt{\begin{aligned}&(\Lambda_0 MF_{r1})^2 + (2\Lambda_0 MF_{r1})^2 + (\Lambda_0 MF_{s1+})^2 + \\ &(\Lambda_0 MF_{s1-})^2 + (\Lambda_0 MF_{s3+})^2\end{aligned}} \end{cases}$$

in the above formula, where $B_{N(rms)}$, $B_{R(rms)}$, $B_{A(rms)}$, and $B_{F(rms)}$ are the root mean square value of air gap magnetic flux density under normal condition, the root mean square value of air gap magnetic flux density under air gap radial eccentricity fault, the root mean square value of air gap magnetic flux density under air gap axial eccentricity fault and the root mean square value of air gap magnetic flux density under stator inter-turn short circuit fault, respectively. Combined with the root mean square formula of magnetic flux density, calculating the eccentricity and short circuit degree by using the change of air gap magnetic flux density amplitude, the formula is as follows:

$$\begin{cases} \varepsilon = \dfrac{B_{R/A(rms)} - B_{N(rms)}}{B_{N(rms)}} \times 100\% \\ fds = \dfrac{B_{F(rms)} - B_{N(rms)}}{B_{N(rms)}} \times 100\% \end{cases}$$

in the above formula, $\varepsilon$ is a degree of air gap eccentricity, and fds is a degree of stator inter-turn short circuit fault.

Therefore, the present invention adopts the above generator fault detection method based on the characteristics of air gap magnetic flux density, and the benefits are as follows:

(1) in this invention, a diagnosis method is provided to detect the fault degree and fault location of air gap eccentricity fault and stator inter-turn short circuit fault by measuring the air gap magnetic flux density of the primary parameter of the generator, the direct detection of the primary parameter can often more directly reflect the running state of the generator, so the results are more accurate and specific.

(2) The monitoring technology in this invention can be set up in multiple generators, thus providing long-term supervision of the network of generators in a region.

(3) It makes up for the defects of traditional technology which takes generator's vibration and current signals as monitoring objects, and the detection effect is more direct and obvious.

The following is a further detailed description of the technical solution of the present invention through drawings and an embodiment.

Tags in the figures:
1, generator; 2, drive motor; 3, Hall sensor; 4, measuring instrument; 5, host computer; 6, stator core, 7, rotor core.

DETAILED DESCRIPTION OF THE EMBODIMENTS

In order to make the purpose, technical solution, and advantages of the embodiment of the present invention more clear, the technical solution of the embodiment of the present invention will be described clearly and completely in the following in combination with the drawings of the embodiment of the present invention. Obviously, the described embodiment is part of the embodiment of the present invention, not all of the embodiments. The components of the embodiment of the present invention usually described and shown in the attached figures, can be arranged and designed in various configurations.

Embodiment

Figure 7:
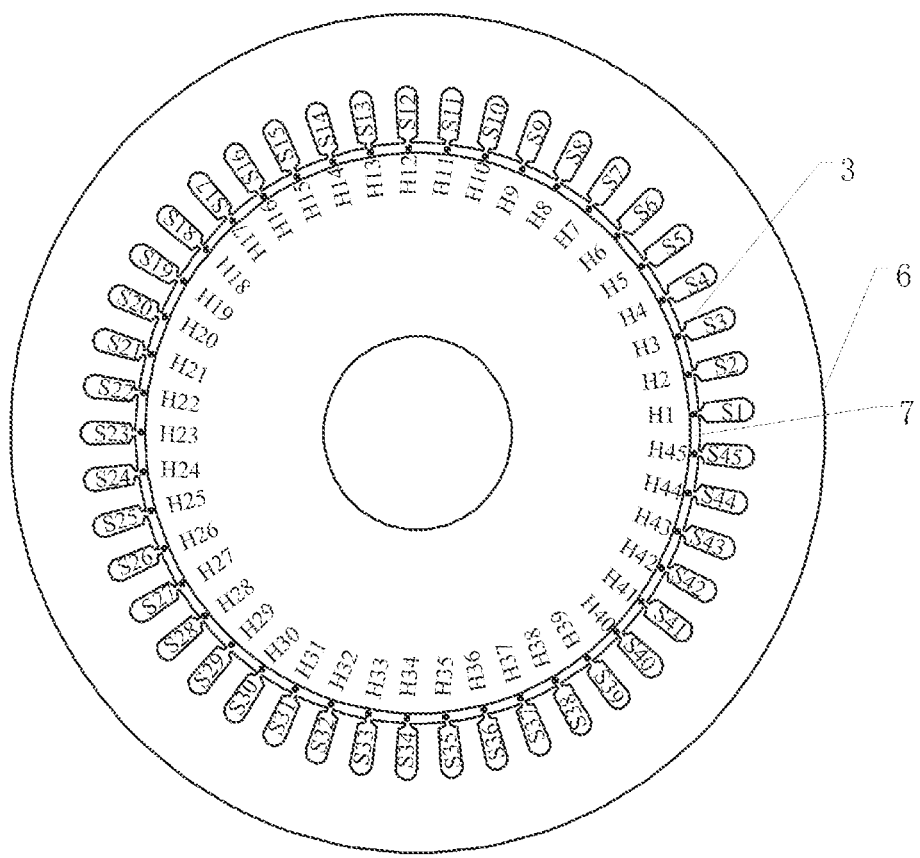
FIG. 7 is a Hall sensor installation diagram of the generator fault detection method based on the characteristics of the air gap magnetic flux density of the present invention.
Figure 8:
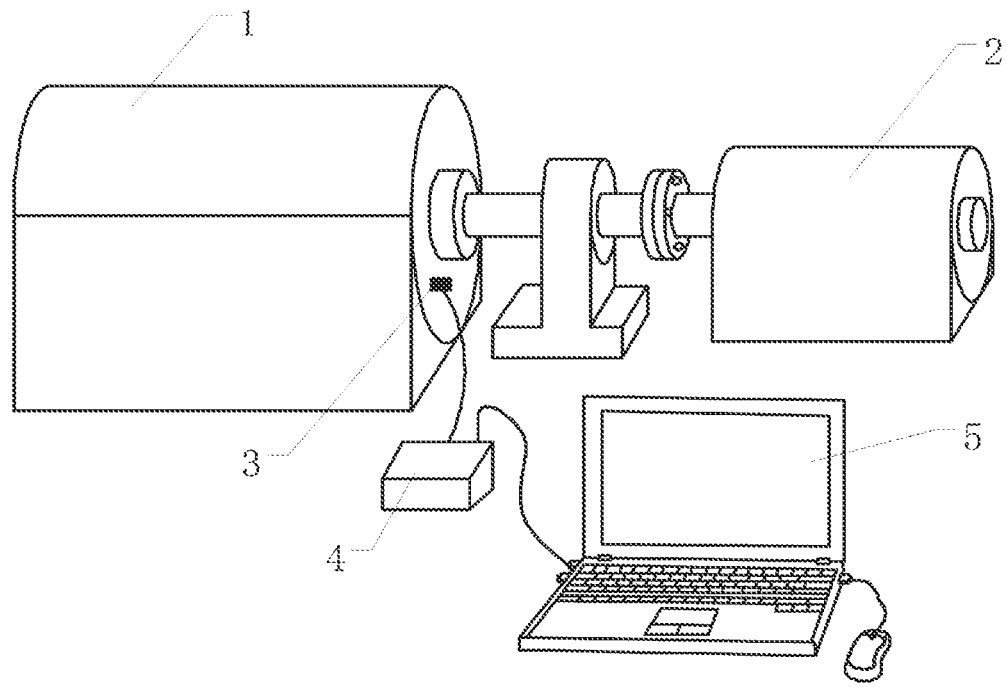
FIG. 8 is a connection diagram of the test platform of the generator fault detection method based on the characteristics of the air gap magnetic flux density of the present invention.

S1: As shown in FIGS. 7-8, detection devices were installed in the generator, the detection devices were Hall sensors 3; the feet of Hall sensors 3 were embedded in stator core 6, the interior was rotor core 7, and its head was used to sense the air gap magnetic flux density of the generator, the generator had a total of 45 stator slots, which were S1, S2, S3, S4, S5, S6, S7, S8, S9, S10, S11, S12, S13, S14, S15, S16, S17, S18, S19, S20, S21, S22, S23, S24, S25, S26, S27, S28, S29, S30, S31, S32, S33, S34, S35, S36, S37, S38, S39, S40, S41, S42, S43, S44 and S45, respectively. Hall sensors 3 were installed in the air gap corresponding to each stator slot, and its foot was embedded in the stator slot, it had a total of 45 Hall sensors 3, the counterclockwise numbers were H1, H2, H3, H4, H5, H6, H7, H8, H9, H10, H11, H12, H13, H14, H15, H16, H17, H18, H19, H20, H21, H22, H23, H24, H25, H26, H27, H28, H29, H30, H31, H32, H33, H34, H35, H36, H37, H38, H39, H40, H41, H42, H43, H44 and H45, respectively. The test platform was generator 1 connected to drive motor 2, host computer 5 connected to measuring instrument 4, measuring instrument connected to Hall sensors 3;

S2: The air gap magnetic flux density of the generator was measured by the head of the Hall sensors to obtain the air gap magnetic flux density signal inside the generator;

S3: The time domain signal of magnetic flux density was transformed into a frequency domain signal by fast Fourier transform, the frequency domain signal of air gap magnetic flux density was obtained, and the characteristic frequency amplitude from 0 Hz to 200 Hz was recorded.

Figure 9:
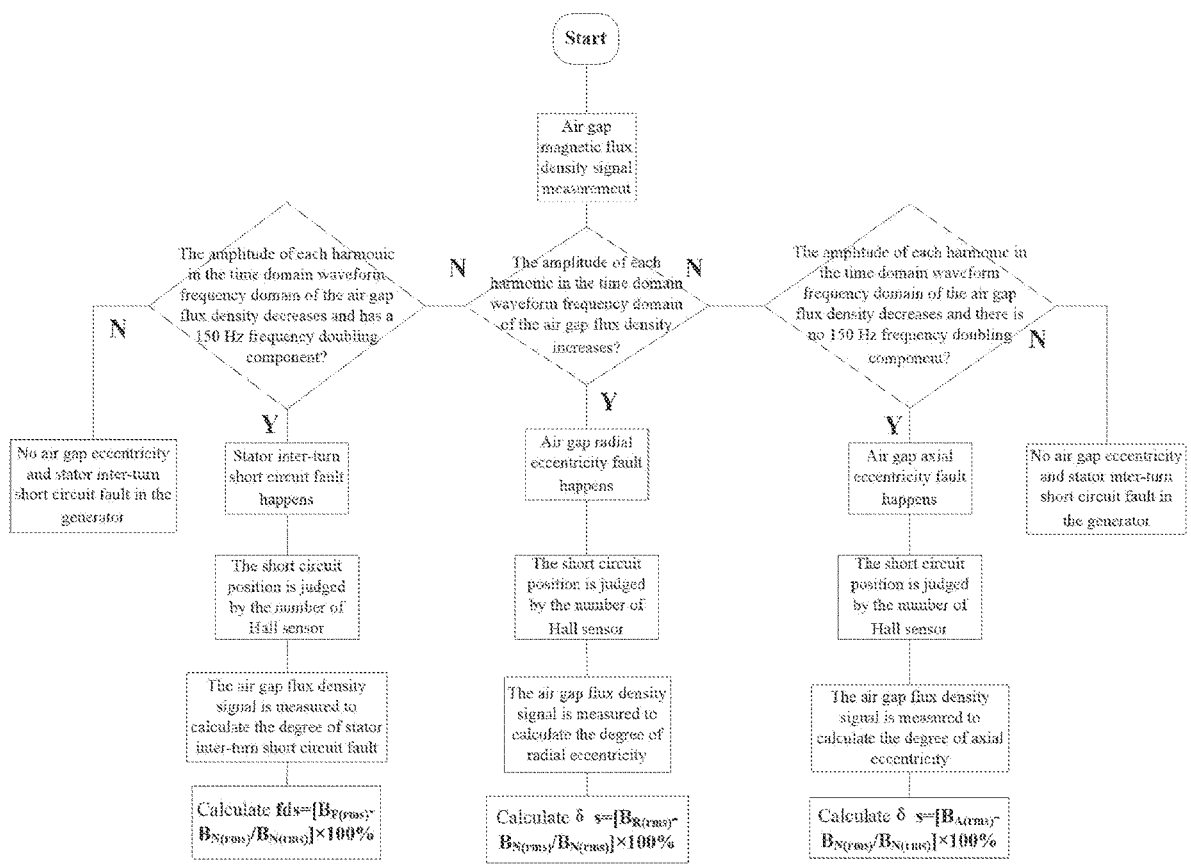
FIG. 9 is a detection flow chart of the generator fault detection method based on the characteristics of the air gap magnetic flux density of the present invention.

S4: As shown in FIG. 9, the air gap eccentricity or stator inter-turn short circuit fault of the generator was judged by comparing the time domain and frequency domain. The time domain signal and the transformed frequency domain signal collected before were compared with the spectrum components in the normal air gap magnetic flux density data sample.

When the amplitude of the time domain waveform and the amplitude of each harmonic component in the spectrum of the air gap magnetic flux density of the generator increased, the generator had a radial eccentricity fault of the air gap.

When the amplitude of the time domain waveform and the amplitude of each harmonic component in the spectrum of the air gap magnetic flux density of the generator reduced, and no new harmonic component appeared at the same time, the generator had an axial eccentricity fault of the air gap.

When the amplitude of the time domain waveform and the amplitude of each harmonic component in the spectrum of the air gap magnetic flux density of the generator reduced, and a 150 Hz frequency component appeared at the same time, the generator had a stator inter-turn short circuit fault.

Figure 1:
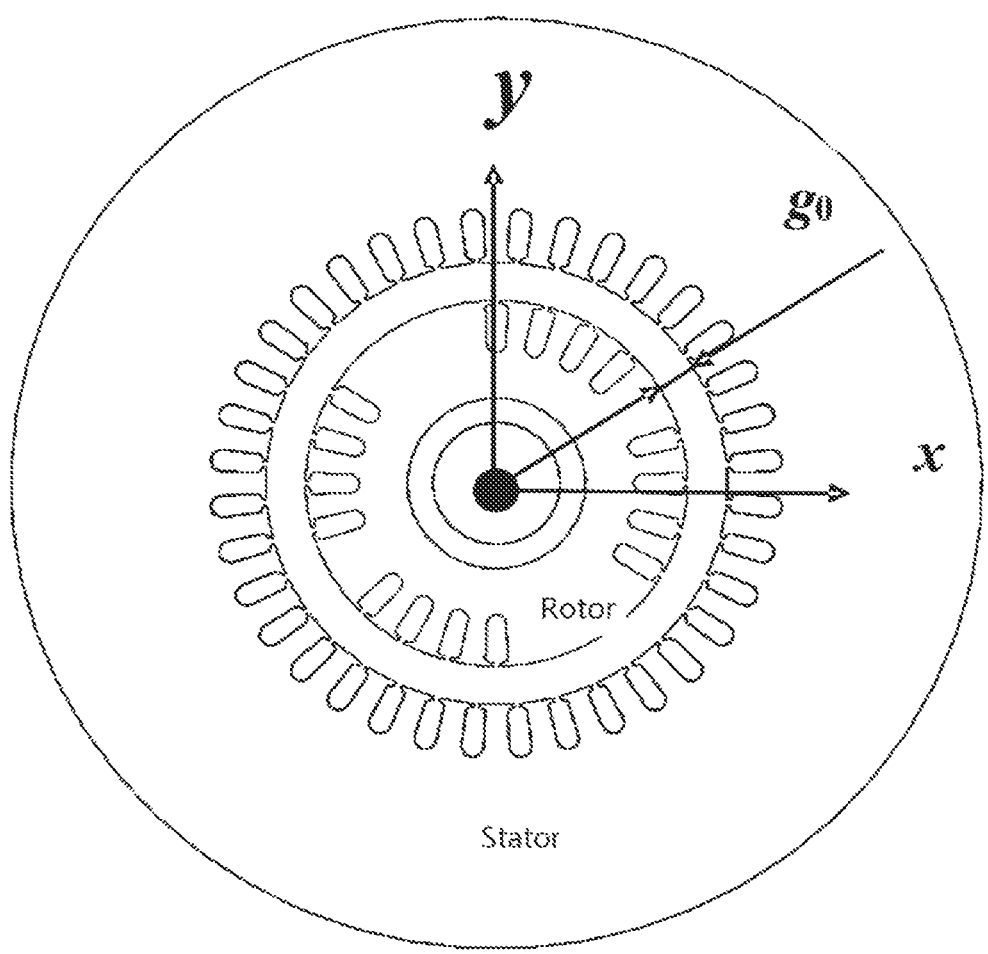
FIG. 1 is a generator section view in normal condition of the generator fault detection method based on the characteristics of the air gap magnetic flux density of the present invention.
Figure 2:
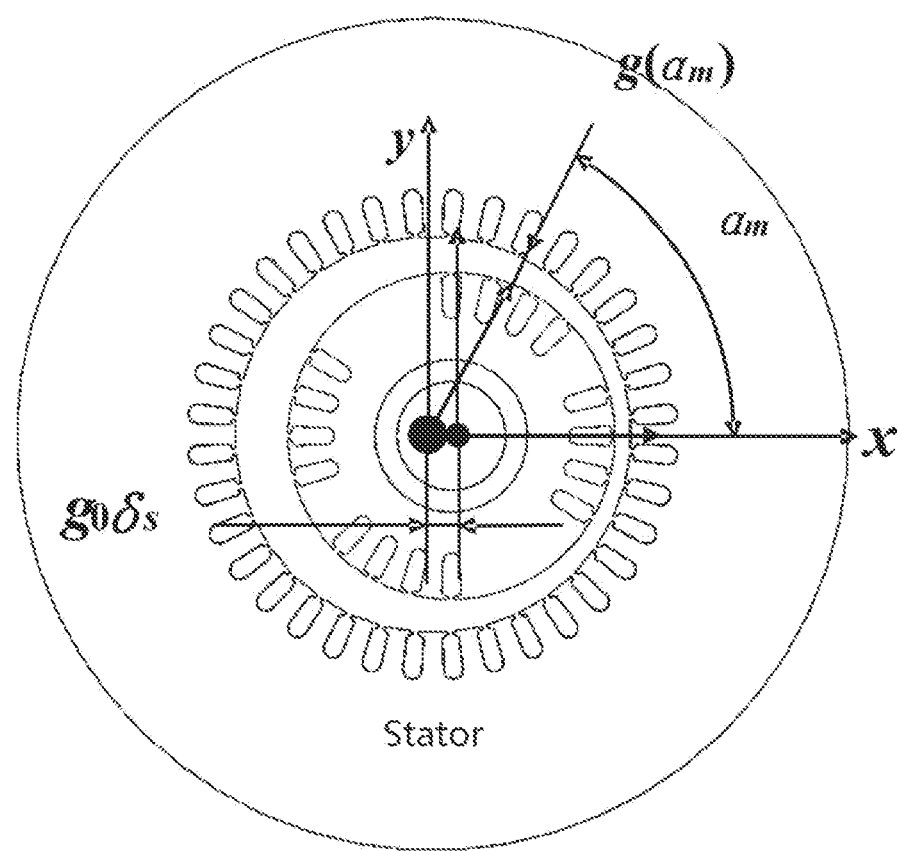
FIG. 2 is a generator section view of the air gap radial eccentricity of the generator fault detection method based on the characteristics of the air gap magnetic flux density of the present invention.
Figure 3:
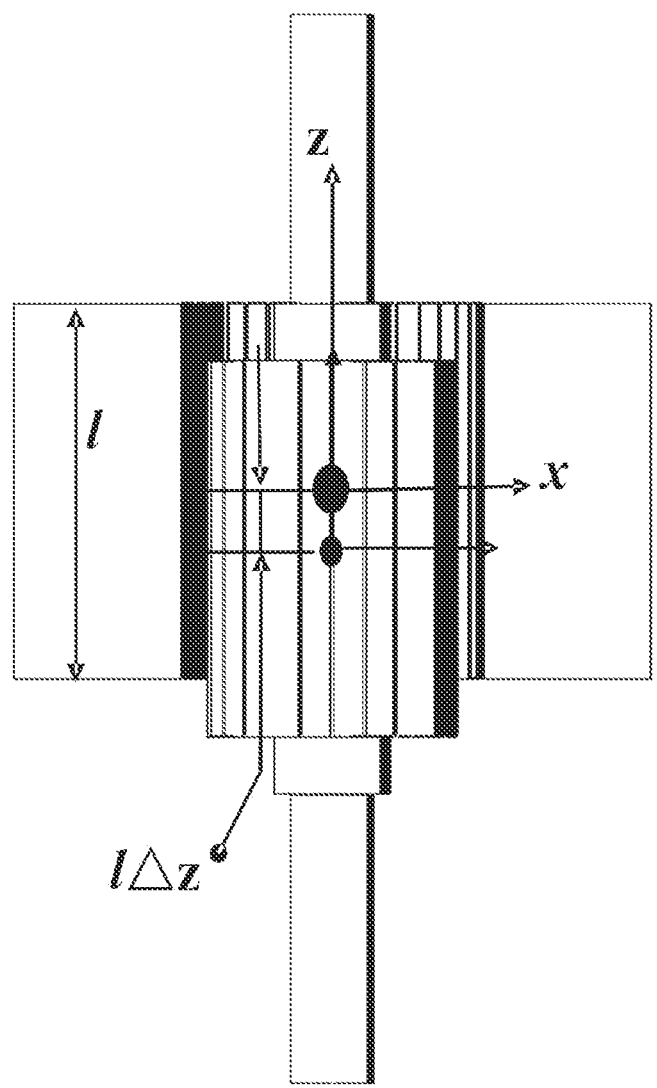
FIG. 3 is a generator section view of the air gap axial eccentricity of the generator fault detection method based on the characteristics of the air gap magnetic flux density of the present invention.
Figure 4:
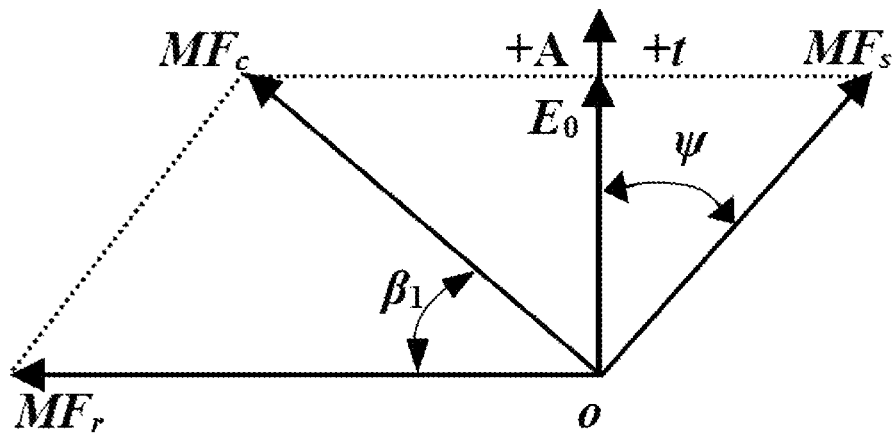
FIG. 4 is a vector diagram of the air gap magnetomotive force of the generator under normal condition and air gap radial eccentricity.
Figure 5:
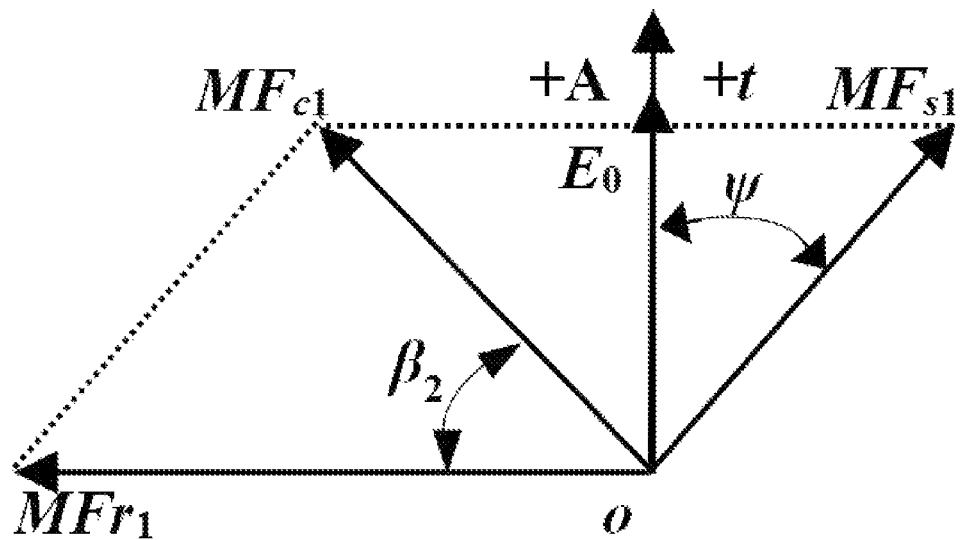
FIG. 5 is a vector diagram of the air gap magnetomotive force of the generator under a stator inter-turn short circuit.
Figure 6:
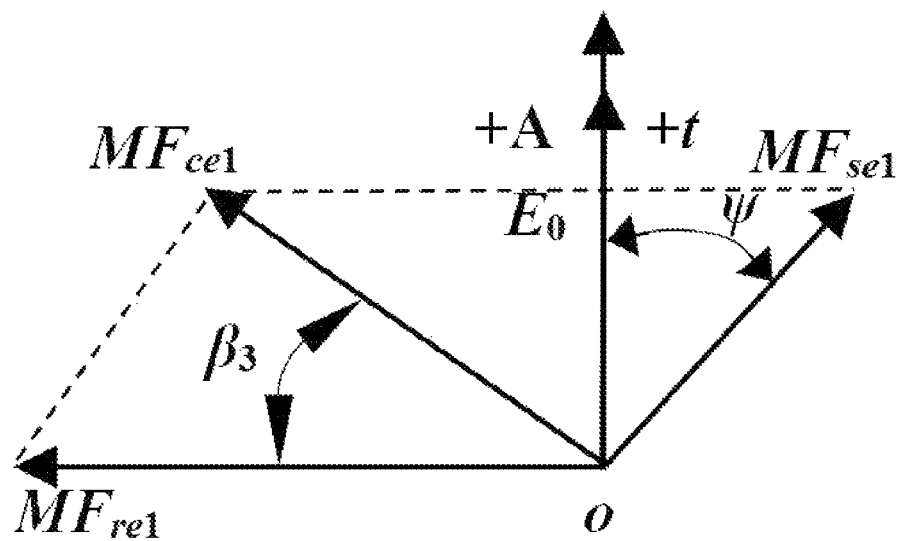
FIG. 6 is a vector diagram of the air gap magnetomotive force of the generator under air gap axial eccentricity.

S5: The value of air gap magnetic flux density was calculated, and the root mean square value of magnetic flux density under different working conditions was selected and compared with the root mean square value of magnetic flux density under normal condition to determine the short circuit degree of stator inter-turn short circuit fault. Firstly, the working conditions of the generator were divided into four kinds: normal condition, air gap radial eccentricity, air gap axial eccentricity, and stator inter-turn short circuit. As shown in FIGS. 1-3, x, y, and z were the x-axis, y-axis, and z-axis of the Cartesian coordinate system, respectively, $g_0$ was an average length of the air gap under normal condition, $\alpha_m$ was a circumferential position angle of the air gap, $\delta_s$ was a relative eccentricity of the air gap in the radial direction, and/was an axial length of the air gap, $\Delta z$ was an axial eccentricity of the air gap; as shown in FIGS. 3-6, $E_0$ was an A-phase electromotive force, A represented an A-phase winding, $\beta_1$ was an angle between the permanent magnet magnetomotive force and the air gap composite magnetomotive force under normal and radial air gap eccentricity, $\beta_2$ was an angle between the permanent magnet magnetomotive force and the air gap composite magnetomotive force under stator inter-turn short circuit, $\beta_3$ was an angle between the permanent magnet magnetomotive force and the air gap composite magnetomotive force under axial air gap eccentricity. In summary, the air gap magnetomotive force expression in four conditions was as follows:

$$f(\alpha_m, t) = \begin{cases} MF_r\cos(\omega t - p\alpha_m + 0.5\pi + \psi) + \\ MF_s\cos(\omega t - p\alpha_m)\ldots\text{normal condition/air gap radial eccentricity} \\ MF_{re1}\cos(\omega t - p\alpha_m + 0.5\pi + \psi) + MF_{se1}\cos(\omega t - p\alpha_m)\ldots \\ \text{air gap radial eccentricity} \\ MF_{re1}\cos(\omega t - p\alpha_m + 0.5\pi + \psi) + \\ MF_{se1}\cos(\omega t - p\alpha_m)\ldots\text{air gap axial eccentricity} \\ MF_{r1}\cos(\omega t - p\alpha_m + 0.5\pi + \psi) + \\ MF_{r2}\cos(3\omega t - p\alpha_m + 0.5\pi + \psi) + \\ MF_{r2}\cos(\omega t + p\alpha_m - 0.5\pi - \psi) + MF_{s1+}\cos(\omega t - p\alpha_m) + \\ MF_{s1-}\cos(\omega t - p\alpha_m) + MF_{s3+}\cos(3\omega t - p\alpha_m)\ldots \\ \text{stator inter-turn short circuit} \end{cases}$$

in the above formula, p was a number of poles of the generator, $\psi$ was an internal power angle of the generator, $\omega$ was an electrical frequency, t was a time, and $\alpha_m$ was a circumferential position angle of the air gap, $MF_r$ was a rotor magnetomotive force in normal conditions and the air gap radial eccentricity fault, which was generated by the permanent magnet, $MF_s$ was a stator magnetomotive force in normal conditions and the air gap radial eccentricity fault, which is generated by the stator winding, $MF_{re1}$ was a rotor magnetomotive force in the air gap axial eccentricity fault, which was generated by the permanent magnet, $MF_{se1}$ was a stator magnetomotive force, which was generated by the stator winding, and $MF_{r1}$ was an amplitude of the 2nd frequency magnetomotive force generated by the permanent magnet with a rotation angle of $-\alpha_m$ under the stator inter-turn short circuit fault, $MF_{r2}$ was an amplitude of 2nd frequency and 3rd frequency magnetomotive force generated by permanent magnet under stator inter-turn short circuit fault, $MF_{s1+}$ and $MF_{s1-}$ were the amplitudes of positive and negative rotation of stator magnetomotive force under stator inter-turn short circuit fault, respectively, $MF_{s3+}$ was the amplitude of 3rd frequency of the stator magnetomotive force under stator inter-turn short circuit fault;

Because the stator inter-turn short circuit fault and the air gap axial eccentricity did not affect the radial length of the generator air gap, the formula for the radial length of the generator air gap was as follows:

$$g(\alpha_m) = \begin{cases} g_0\ldots\text{normal condition/stator inter-turn short circuit/air gap axial eccentricity} \\ g_0(1 - \delta_s \cos\alpha_m)\ldots\text{air gap radial eccentricity} \end{cases}$$

in the above formula, $g_0$ was an average length of the air gap under normal condition, $\alpha_m$ was a circumferential position angle of the air gap, and $\delta_s$ was a radial relative eccentricity of the air gap;

since the air gap permeance per unit area was inversely proportional to the air gap radial air gap length, it can be expressed as the following formula:

$$\Lambda(\alpha_m) = \frac{\mu_0}{g(\alpha_m)} = \begin{cases} \Lambda_0\ldots\text{normal condition/stator inter-turn short circuit/air gap axial eccentricity} \\ \Lambda_0(1 + 0.5\delta_s^2 + \delta_s \cos\alpha_m + 0.5\delta_s^2 \cos 2\alpha_m)\ldots\text{air gap radial eccentricity} \end{cases}$$

in the above formula, $\Lambda_0$ was a permeability constant per unit area of the air gap, and $\mu_0$ was an air permeability;

because the air gap magnetic flux density of the generator was obtained by multiplying the air gap magnetomotive force and the air gap permeance, the expression of the air gap magnetic flux density of the generator under four working conditions was as follows:

$$B(\alpha_m, t) = f(\alpha_m, t)\Lambda(\alpha_m) = \begin{cases} MF_r\cos(\omega t - p\alpha_m + 0.5\pi + \psi) + \\ MF_s\cos(\omega t - p\alpha_m)\Lambda_0\ldots\text{normal condition} \\ MF_r\cos(\omega t - p\alpha_m + 0.5\pi + \psi) + MF_s\cos(\omega t - p\alpha_m)\Lambda_0 \times \\ (1 + 0.5\delta_s^2 + \delta_s \cos\alpha_m + 0.5\delta_s^2 + \cos 2\alpha_m)\ldots \\ \text{air gap radial eccentricity} \\ MF_{re1}\cos(\omega t - p\alpha_m + 0.5\pi + \psi) + \\ MF_{se1}\cos(\omega t - p\alpha_m)\Lambda_0\ldots\text{air gap axial eccentricity} \\ MF_r\cos(\omega t - p\alpha_m + 0.5\pi + \psi) + MF_{r2}\cos(3\omega t - p\alpha_m + 0.5\pi + \psi) + \\ MF_{r2}\cos(\omega t + p\alpha_m - 0.5\pi - \psi) + MF_{s1+}\cos(\omega t - p\alpha_m) + \\ MF_{s1-}\cos(\omega t + p\alpha_m) + MF_{s3+}\cos(3\omega t - p\alpha_m)\Lambda_0\ldots \\ \text{stator inter-turn short circuit} \end{cases}$$

Through the above formula, the root mean square value of the magnetic flux density amplitude under normal condition, air gap radial eccentricity, air gap axial eccentricity, and stator inter-turn short circuit fault were calculated. The expression was as follows:

$$\begin{cases} B_{N(rms)} = \sqrt{(\Lambda_0 MF_r)^2 + (\Lambda_0 MF_s)^2} \\ B_{R(rms)} = \sqrt{\begin{array}{l}[(1 + 0.5\delta_s^2 + \delta_s \cos\alpha_m + 0.5\delta_s^2 \cos 2\alpha_m)MF_r]^2 + \\ [(1 + 0.5\delta_s^2 + \delta_s \cos\alpha_m + 0.5\delta_s^2 \cos 2\alpha_m)MF_s]^2\end{array}} \\ B_{A(rms)} = \sqrt{(\Lambda_0 MF_{re1})^2 + (\Lambda_0 MF_{se1})^2} \\ B_{F(rms)} = \sqrt{\begin{array}{l}(\Lambda_0 MF_{r1})^2 + (2\Lambda_0 MF_{r1})^2 + (\Lambda_0 MF_{s1+})^2 + \\ (\Lambda_0 MF_{s1-})^2 + (\Lambda_0 MF_{s3+})^2\end{array}} \end{cases}$$

in the above formula, where $B_{N(rms)}$, $B_{R(rms)}$, $B_{A(rms)}$, and $B_{F(rms)}$ were the root mean square value of air gap magnetic flux density under normal condition, the root mean square value of air gap magnetic flux density under air gap radial eccentricity fault, the root mean square value of air gap magnetic flux density under air gap axial eccentricity fault and the root mean square value of air gap magnetic flux density under stator inter-turn short circuit fault, respectively. Combined with the root mean square formula of air gap magnetic flux density, the eccentricity, and short circuit degree were calculated by using the change of air gap magnetic flux density amplitude. The formula was as follows:

$$\begin{cases} \varepsilon = \dfrac{B_{R/A(rms)} - B_{N(rms)}}{B_{N(rms)}} \times 100\% \\ fds = \dfrac{B_{F(rms)} - B_{N(rms)}}{B_{N(rms)}} \times 100\% \end{cases}$$

In the above formula, ε was the degree of air gap eccentricity, and fds was the degree of stator inter-turn short circuit fault.

Figure 10:
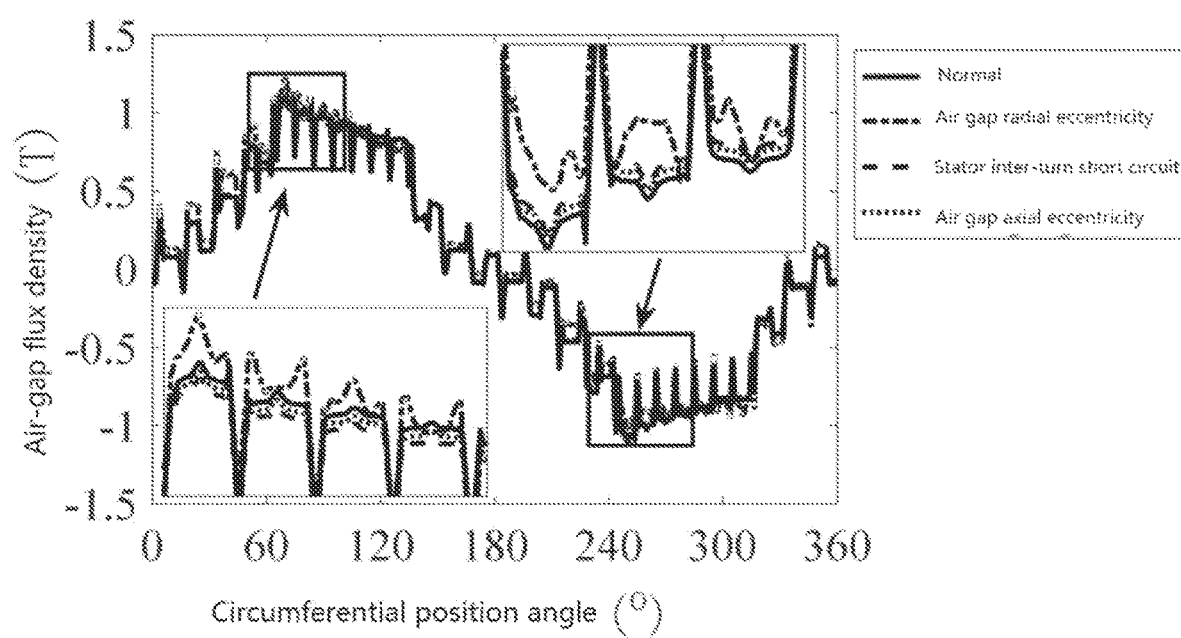
FIG. 10 is an experimental data diagram of the generator fault detection method based on the characteristics of the air gap magnetic flux density of the present invention.

Hall sensors were placed in the generator. When the generator runs smoothly, twenty sets of air gap magnetic flux density signals of the generator were collected, and the average values of the twenty sets of data were obtained respectively, and the sample data of air gap magnetic flux density signals were obtained, as shown in FIG. 10.

Therefore, the Hall sensors can be used to directly measure the air gap magnetic flux density of the generator. It can not only detect the air gap eccentricity fault and stator inter-turn short circuit fault but also diagnose the fault location and degree, which has a positive significance for the smooth operation of the generator.

Finally, it should be explained that the above embodiment is only used to explain the technical solution of the present invention rather than restrict it. Although the present invention is described in detail concerning the better embodiment, the ordinary technical personnel in this field should understand that they can still modify or replace the technical solution of the present invention, and these modifications or equivalent substitutions cannot make the modified technical solution out of the spirit and scope of the technical solution of the present invention.

What is claimed is:

1. A generator fault detection method based on characteristics of an air gap magnetic flux density, comprising the following steps:
   S1: installing detection devices on a generator and building a test platform;
   S2: obtaining an air gap magnetic flux density signal through the detection devices;
   S3: transforming a time domain signal of the air gap magnetic flux density into a frequency domain signal by using a fast Fourier transform;
   S4: confirming an operation condition of the generator through a comparison of time domain and frequency domain;
   S5: obtaining a value of the air gap magnetic flux density by calculation, selecting, and then comparing a root mean square value of the air gap magnetic flux density under different working conditions with a root mean square value of the air gap magnetic flux density under normal condition to determine a degree of air gap eccentricity and a short circuit degree of a stator inter-turn short circuit fault; wherein in S5, the working conditions of the generator are divided into four types: normal condition, air gap radial eccentricity, air gap axial eccentricity, and stator inter-turn short circuit, wherein an expression of an air gap magnetomotive force of the generator in the above four conditions is calculated as follows:

$f(\alpha_m, t)$ wherein p is a number of poles of the generator, φ is an internal power angle of the generator, ω is an electrical frequency, t is a time, $\alpha_m$ is a circumferential position angle of an air gap, $MF_s$ is a rotor magnetomotive force in normal condition and an air gap radial eccentricity fault and is generated by a permanent magnet, $MF_s$ is a stator magnetomotive force in normal condition and the air gap radial eccentricity fault and is generated by a stator winding, $MF_{re1}$ is a rotor magnetomotive force in the air gap axial eccentricity fault and is generated by the permanent magnet, $MF_{se1}$ is a stator magnetomotive force and is generated by the stator winding, and $MF_{r1}$ is an amplitude of a 2nd frequency magnetomotive force generated by the permanent magnet with a rotation angle of $-\alpha_m$, under the stator inter-turn short circuit fault, $MF_{r2}$ is an amplitude of 2nd frequency and 3rd frequency magnetomotive force generated by the permanent magnet under the stator inter-turn short circuit fault, $MF_{s1+}$ and $MF_{s1-}$ are amplitudes of positive and negative rotation of the stator magnetomotive force under the stator inter-turn short circuit fault, $MF_{s3+}$ is an amplitude of 3rd frequency of the stator magnetomotive force under the stator inter-turn short circuit fault;

a formula of a radial length of the air gap of the generator is as follows:

wherein $g_0$ is an average length of the air gap under normal condition, $\alpha_m$, is the circumferential position angle of the air gap, and $\delta_s$ is a radial relative eccentricity of the air gap;

a permeability per unit area is inversely proportional to the radial length of the air gap and is expressed as the following formula:

wherein $\Lambda_0$ is a permeability constant per unit area of the air gap, and $\mu_0$ is an air permeability;

the air gap magnetic flux density of the generator is obtained by multiplying the air gap magnetomotive force and an air gap permeance, and an expression of the air gap magnetic flux density of the generator under four working conditions is as follows:

calculating the root mean square value of the air gap magnetic flux density amplitude under normal condition, the air gap radial eccentricity, the air gap axial eccentricity, and the stator inter-turn short circuit fault by the above formula, wherein the expression is as follows:

wherein $B_{N(rms)}$, $B_{R(rms)}$, $B_{A(rms)}$, and $B_{r(rms)}$ are the root mean square value of the air gap magnetic flux density under normal condition, the root mean square value of the air gap magnetic flux density under the air gap radial eccentricity fault, the root mean square value of the air gap magnetic flux density under the air gap axial eccentricity fault and the root mean square value of the air gap magnetic flux density under the stator inter-turn short circuit fault, respectively; combined with a root mean square formula of the air gap magnetic flux density, calculating an eccentricity and short circuit degree by using a change of an air gap magnetic flux density amplitude, wherein the formula is as follows:

$$\begin{cases} \varepsilon = \dfrac{B_{R/A(rms)} - B_{N(rms)}}{B_{N(rms)}} \times 100\% \\ fds = \dfrac{B_{F(rms)} - B_{N(rms)}}{B_{N(rms)}} \times 100\% \end{cases}$$

wherein ε is the degree of air gap eccentricity, and fds is the degree of the stator inter-turn short circuit fault.

2. The generator fault detection method based on the characteristics of the air gap magnetic flux density according to claim 1, wherein each of the detection devices in S1 is a Hall sensor, wherein a foot of each of the detection devices is mounted into a stator slot in the generator.

3. The generator fault detection method based on the characteristics of the air gap magnetic flux density according to claim 1, wherein the test platform in S1 is that the generator is connected to a drive motor, a host computer is connected to a measuring instrument, and the measuring instrument is connected to the detection devices.

4. The generator fault detection method based on the characteristics of the air gap magnetic flux density according to claim 1, wherein a method for obtaining the air gap magnetic flux density in S2 is to measure the air gap magnetic flux density of the generator through heads of Hall sensors.

5. The generator fault detection method based on the characteristics of the air gap magnetic flux density according to claim 1, wherein S3 further comprises: uploading the air gap magnetic flux density signal to the test platform, performing the fast Fourier transform to obtain the frequency domain signal of the air gap magnetic flux density, and recording a characteristic frequency amplitude of 0 Hz to 200 Hz.

6. The generator fault detection method based on the characteristics of the air gap magnetic flux density according to claim 1, wherein in S4, a specific method for confirming the operation condition of the generator through the comparison of the time domain and the frequency domain is to compare the time domain signal with the frequency domain signal with spectrum components in an air gap magnetic flux density data sample under normal condition;

when an amplitude of a time domain waveform and an amplitude of each harmonic component in a spectrum of the air gap magnetic flux density of the generator increase, the generator has a radial eccentricity fault of an air gap;

when the amplitude of the time domain waveform and the amplitude of each harmonic component in the spectrum of the air gap magnetic flux density of the generator reduce, and no new harmonic component appears at the same time, the generator has an axial eccentricity fault of the air gap;

when the amplitude of the time domain waveform and the amplitude of each harmonic component in the spectrum of the air gap magnetic flux density of the generator reduce, and a 150 Hz frequency component appears at the same time, the generator has the stator inter-turn short circuit fault.

* * * * *